United States Patent
Tabuchi et al.

(10) Patent No.: US 11,189,776 B2
(45) Date of Patent: Nov. 30, 2021

(54) PIEZOELECTRIC ELEMENT AND METHOD FOR MANUFACTURING PIEZOELECTRIC ELEMENT

(71) Applicant: Sumitomo Precision Products Co., Ltd., Amagasaki (JP)

(72) Inventors: Yusuke Tabuchi, Amagasaki (JP); Gen Matsuoka, Amagasaki (JP); Takashi Ikeda, Amagasaki (JP)

(73) Assignee: Sumitomo Precision Products Co., Ltd., Amagasaki (JP)

( * ) Notice: Subject to any disclaimer, the term of this patent is extended or adjusted under 35 U.S.C. 154(b) by 768 days.

(21) Appl. No.: 15/758,999

(22) PCT Filed: Aug. 31, 2016

(86) PCT No.: PCT/JP2016/075433
§ 371 (c)(1),
(2) Date: Mar. 9, 2018

(87) PCT Pub. No.: WO2017/043383
PCT Pub. Date: Mar. 16, 2017

(65) Prior Publication Data
US 2018/0287045 A1 Oct. 4, 2018

(30) Foreign Application Priority Data
Sep. 11, 2015 (JP) .............................. JP2015-179069

(51) Int. Cl.
*H01L 41/047* (2006.01)
*H01L 41/29* (2013.01)
(Continued)

(52) U.S. Cl.
CPC ........ *H01L 41/0478* (2013.01); *H01L 41/047* (2013.01); *H01L 41/0475* (2013.01);
(Continued)

(58) Field of Classification Search
CPC ............... H01L 41/0478; H01L 41/047; H01L 41/0475; H01L 41/0533; H01L 41/09;
(Continued)

(56) References Cited

U.S. PATENT DOCUMENTS 6,194,228 B1    2/2001   Fujiki et al.
6,931,700 B2    8/2005   Uchiyama
(Continued)

FOREIGN PATENT DOCUMENTS

JP    11-195768 A    7/1999
JP    2003-179282 A    6/2003
(Continued)

OTHER PUBLICATIONS

International Search Report (PCT/ISA/210) issued in PCT Application No. PCT/JP2016/075433 dated Oct. 25, 2016 with English translation (three pages).
(Continued)

*Primary Examiner* — Bryan P Gordon
(74) *Attorney, Agent, or Firm* — Crowell & Moring LLP

(57) ABSTRACT

This piezoelectric element includes a lower electrode formed on a substrate, a piezoelectric layer formed on the lower electrode, and an upper electrode formed on the piezoelectric layer. The upper electrode includes a first upper electrode layer made of a metal oxide including an amorphous portion at least at a boundary with the piezoelectric layer and a second upper electrode layer formed on the first upper electrode layer.

18 Claims, 2 Drawing Sheets

(51) Int. Cl.
*H01L 41/09* (2006.01)
*H01L 41/053* (2006.01)
*H01L 41/23* (2013.01)
*H01L 41/187* (2006.01)

(52) U.S. Cl.
CPC .......... *H01L 41/0533* (2013.01); *H01L 41/09* (2013.01); *H01L 41/23* (2013.01); *H01L 41/29* (2013.01); *H01L 41/1876* (2013.01); *H01L 41/1878* (2013.01)

(58) Field of Classification Search
CPC ..... H01L 41/23; H01L 41/29; H01L 41/1876; H01L 41/1878
USPC .................................................. 310/363–366
See application file for complete search history.

(56) References Cited

U.S. PATENT DOCUMENTS

| | | | | |
|---|---|---|---|---|
| 7,122,851 B2* | 10/2006 | Itokawa | ............ | H01L 27/11502 257/295 |
| 7,233,094 B2* | 6/2007 | Akiyama | ............. | H01L 41/316 29/25.35 |
| 8,628,174 B2 | 1/2014 | Takahashi | | |
| 8,981,627 B2 | 3/2015 | Sakuma et al. | | |
| 9,079,400 B2 | 7/2015 | Kusunoki et al. | | |
| 9,401,469 B2 | 7/2016 | Xiong et al. | | |
| 2005/0001251 A1* | 1/2005 | Itokawa | ............ | H01L 27/11507 257/296 |
| 2009/0236933 A1* | 9/2009 | Takahashi | ............ | H01L 41/332 310/311 |
| 2017/0257076 A1* | 9/2017 | Kaneko | ................. | H03H 9/174 |
| 2018/0019725 A1* | 1/2018 | Lim | ..................... | H01L 41/277 |

FOREIGN PATENT DOCUMENTS

| | | |
|---|---|---|
| JP | 2004-335708 A | 11/2004 |
| JP | 2010-219153 A | 9/2010 |
| JP | 2014-54745 A | 3/2014 |
| JP | 2015-26676 A | 2/2015 |
| JP | 2015-519720 A | 7/2015 |
| JP | 2016-72589 A | 5/2016 |

OTHER PUBLICATIONS

Japanese-language Written Opinion (PCT/ISA/237) issued in PCT Application No. PCT/JP2016/075433 dated Oct. 25, 2016 (four pages).

* cited by examiner

PIEZOELECTRIC ELEMENT AND METHOD FOR MANUFACTURING PIEZOELECTRIC ELEMENT

TECHNICAL FIELD

The present invention relates to a piezoelectric element and a method for manufacturing a piezoelectric element.

BACKGROUND ART

In general, a piezoelectric element is known. A piezoelectric element is disclosed in Japanese Patent Laid-Open No. 2015-026676, for example.

The aforementioned Japanese Patent Laid-Open No. 2015-026676 discloses a piezoelectric element including a lower electrode formed on a substrate, a piezoelectric layer formed on the lower electrode, and an upper electrode formed on the piezoelectric layer. In the piezoelectric element disclosed in the aforementioned Japanese Patent Laid-Open No. 2015-026676, the lower electrode includes a first electrode made of platinum and a second electrode made of SRO (strontium ruthenate). In addition, the upper electrode includes a third electrode made of SRO and a fourth electrode made of platinum. When the second electrode and the third electrode are deposited, the deposition is performed in a state where the substrate is heated to 300° C. or higher in order to set the orientation of SRO crystals to a desired orientation.

PRIOR ART

Patent Document

Patent Document 1: Japanese Patent Laid-Open No. 2015-026676

SUMMARY OF THE INVENTION

Problem to be Solved by the Invention

However, in the conventional piezoelectric element as disclosed in the aforementioned Japanese Patent Laid-Open No. 2015-026676, there is a disadvantage that the piezoelectric constant $d_{31}$ (the piezoelectric constant in a direction along the electrode surface) of the piezoelectric element decreases when an alternating-current voltage is applied for a predetermined time. Therefore, there is a problem that the performance of the piezoelectric element deteriorates due to use.

The present invention has been proposed in order to solve the aforementioned problem, and one object of the present invention is to provide a piezoelectric element capable of significantly reducing or preventing a deterioration in its performance due to use and a method for manufacturing the piezoelectric element.

Means for Solving the Problem

As a result of earnest investigations to solve the aforementioned problem, the inventors of this application have found that an upper electrode includes a first electrode layer made of a metal oxide including an amorphous portion at least at a boundary with a piezoelectric layer such that even after application of an alternating-current voltage for a predetermined time, it is possible to suppress a decrease in the piezoelectric constant $d_{31}$ of a piezoelectric element, and hence it is possible to suppress a deterioration in the performance of the piezoelectric element due to use. That is, a piezoelectric element according to a first aspect of the present invention is a piezoelectric element incorporated in an electronic device, and includes a lower electrode formed on a substrate or a base film, a piezoelectric layer formed on the lower electrode, and an upper electrode formed on the piezoelectric layer, and the upper electrode includes a first electrode layer made of a metal oxide including an amorphous portion at least at a boundary with the piezoelectric layer and a second electrode layer formed on the first electrode layer. The piezoelectric element according to the present invention is a piezoelectric element as a finished product excluding intermediate products in the process of manufacturing the piezoelectric element.

In the piezoelectric element according to the first aspect of the present invention, as hereinabove described, the upper electrode includes the first electrode layer made of a metal oxide including an amorphous portion at least at the boundary with the piezoelectric layer such that it is possible to suppress a decrease in the piezoelectric constant $d_{31}$ of the piezoelectric element even after application of an alternating-current voltage for a predetermined time. Thus, it is possible to suppress a deterioration in the performance of the piezoelectric element due to use.

In the aforementioned piezoelectric element according to the first aspect, the metal oxide of the first electrode layer preferably includes strontium ruthenate. According to this structure, the first electrode layer including strontium ruthenate (SRO) includes an amorphous portion at the boundary with the piezoelectric layer such that it is possible to effectively suppress movement of oxygen from the piezoelectric layer made of a metal oxide to the second electrode layer, and hence it is conceivably possible to effectively suppress a decrease in the piezoelectric constant $d_{31}$ of the piezoelectric element even after application of an alternating-current voltage for a predetermined time.

In the aforementioned piezoelectric element according to the first aspect, a thickness of the first electrode layer is preferably 2 nm or more and 40 nm or less. According to this structure, the thickness of the first electrode layer is set to 2 nm or more such that it is possible to effectively suppress movement of oxygen from the piezoelectric layer made of a metal oxide to the second electrode layer. Furthermore, the thickness of the first electrode layer is set to 40 nm or less such that it is possible to suppress occurrence of cracking in the first electrode layer including an amorphous metal oxide.

In this case, the second electrode layer preferably includes a reducible metal atom. According to this structure, even when the reducible metal atom is used for the upper electrode, the first electrode layer can effectively suppress movement of oxygen from the piezoelectric layer made of a metal oxide to the second electrode layer.

In the aforementioned piezoelectric element according to the first aspect, a protective layer of 100 nm or more is preferably provided on the first electrode layer. According to this structure, it is possible to effectively suppress cracking of the first electrode layer including an amorphous metal oxide.

A method for manufacturing a piezoelectric element according to a second aspect of the present invention includes forming a lower electrode on a substrate or a base film, forming a piezoelectric layer on the lower electrode, and forming an upper electrode on the piezoelectric layer, and the forming of the upper electrode includes forming a first electrode layer made of a metal oxide including an amorphous portion at least at a boundary with the piezoelectric layer and forming a second electrode layer on the first electrode layer under a temperature condition lower than a temperature at which the metal oxide of the first electrode layer crystallizes.

In the method for manufacturing a piezoelectric element according to the second aspect of the present invention, by the configuration described above, it is possible to suppress a decrease in the piezoelectric constant $d_{31}$ of the piezoelectric element even after application of an alternating-current voltage for a predetermined time. Thus, the piezoelectric element capable of suppressing a deterioration in its performance due to use can be manufactured. Furthermore, the upper electrode is formed under the temperature condition lower than the temperature at which the metal oxide of the first electrode layer crystallizes such that it is possible to suppress an increase in the relative permittivity of the piezoelectric element. Thus, it is possible to suppress occurrence of noise due to an increase in the capacitance of the piezoelectric element, and hence even when the piezoelectric element is driven by feedback control, accurate control can be performed.

In the aforementioned method for manufacturing a piezoelectric element according to the second aspect, all steps after the forming of the upper electrode are preferably performed under the temperature condition lower than the temperature at which the metal oxide of the first electrode layer crystallizes. According to this structure, it is possible to prevent the metal oxide of the first electrode layer from crystallizing in the subsequent steps.

Effect of the Invention

According to the present invention, as hereinabove described, the piezoelectric element capable of significantly reducing or preventing a deterioration in its performance due to use and the method for manufacturing the piezoelectric element can be provided.

MODES FOR CARRYING OUT THE INVENTION

Figure 1:
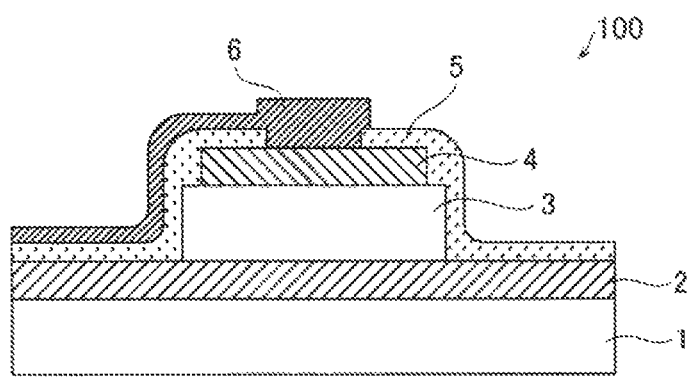
FIG. 1 A schematic view showing an entire piezoelectric element according to an embodiment of the present invention.

An embodiment of the present invention is hereinafter described on the basis of the drawings.

Structure of Piezoelectric Element

The structure of a piezoelectric element 100 according to the embodiment of the present invention is now described with reference to FIGS. 1 and 2.

The piezoelectric element 100 according to the embodiment of the present invention is used as an actuator. For example, the piezoelectric element 100 is used as an actuator driven by feedback control. As shown in FIG. 1, the piezoelectric element 100 includes a substrate 1, a lower electrode 2, a piezoelectric layer 3, an upper electrode 4, an insulating layer 5, and a lead-out wire 6. The insulating layer 5 and the lead-out wire 6 are examples of a "protective layer" in the claims.

Figure 2:
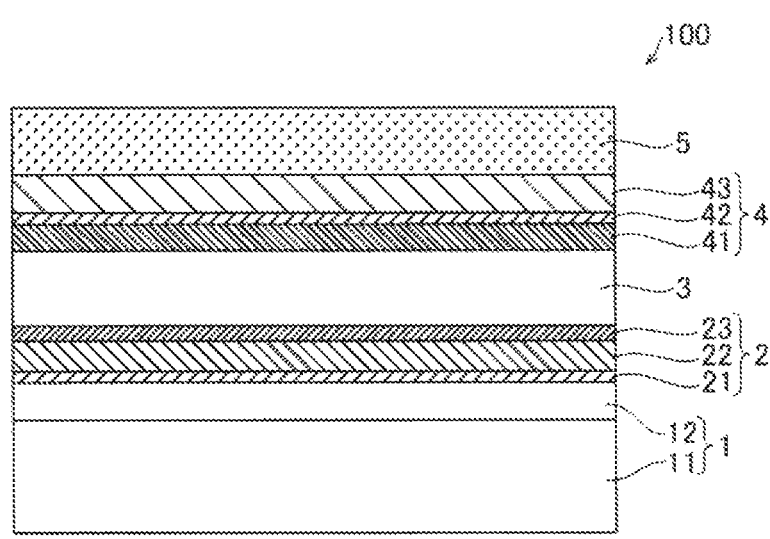
FIG. 2 A schematic view showing a main portion of the piezoelectric element.

As shown in FIG. 2, the substrate 1 includes a silicon substrate 11 and a silicon oxide layer 12 formed on the silicon substrate 11 and made of $SiO_2$. The silicon oxide layer 12 is formed on a surface of the silicon substrate 11 by thermally oxidizing the silicon substrate 11. The substrate 1 has a thickness of about 300 μm or more and about 725 μm or less, for example. The silicon oxide layer 12 has a thickness of about 100 nm or more and about 500 nm or less, for example.

The lower electrode 2 is formed on the substrate 1. The lower electrode 2 includes a first lower electrode layer 21, a second lower electrode layer 22, and a third lower electrode layer 23. Specifically, the lower electrode 2 is formed by stacking the first lower electrode layer 21, the second lower electrode layer 22, and the third lower electrode layer 23 in this order from the substrate 1 side. The first lower electrode layer 21 is made of titanium (Ti). In addition, the first lower electrode layer 21 has a thickness of about 1 nm or more and about 20 nm or less, for example. The second lower electrode layer 22 is made of platinum (Pt). Furthermore, the second lower electrode layer 22 has a thickness of about 50 nm or more and about 200 nm or less, for example.

The third lower electrode layer 23 is made of a metal oxide. For example, the third lower electrode layer 23 is made of strontium ruthenate (SRO), lithium nickel oxide (LNO), ruthenium oxide (RuOx), iridium oxide (IrOx), $LaSrCoO_3$, or the like. In addition, the metal oxide of the third lower electrode layer 23 crystallizes. That is, the third lower electrode layer 23 functions as a seed layer (seed crystal layer) for setting the crystal orientation of the piezoelectric layer 3 to a desired orientation. Furthermore, the third lower electrode layer 23 has a thickness of about 2 nm or more and about 40 nm or less, for example.

The piezoelectric layer 3 is formed on the lower electrode 2. The piezoelectric layer 3 is deformed when a voltage is applied thereto. The piezoelectric layer 3 is made of a ferroelectric. For example, the piezoelectric layer 3 is made of lead zirconate titanate (PZT (Pb(Zr, Ti)$O_3$)), bismuth titanate (BTO ($Bi_4Ti_3O_{12}$)), bismuth lanthanum titanate (BLT ((Bi, La)$_4Ti_3O_{12}$)), strontium bismuth tantalate (SBT ($SrBi_2Ta_2O_9$)), lead lanthanum zirconate titanate (PLZT ((PbLa) (ZrTi)$O_3$)), or the like. Furthermore, the piezoelectric layer 3 has a thickness of about 0.75 μm or more and about 5 μm or less, for example.

The upper electrode 4 is formed on the piezoelectric layer 3. The upper electrode 4 includes a first upper electrode layer 41, a second upper electrode layer 42, and a third upper electrode layer 43. Specifically, the upper electrode 4 is formed by stacking the first upper electrode layer 41, the second upper electrode layer 42, and the third upper electrode layer 43 in this order from the piezoelectric layer 3 side. The first upper electrode layer 41, the second upper electrode layer 42, and the third upper electrode layer 43 are examples of a "first electrode layer", a "second electrode layer", and a "third electrode layer" in the claims, respectively. The second upper electrode layer 42 and the third upper electrode layer 43 are each an example of a "protective layer" in the claims.

According to this embodiment, the first upper electrode layer 41 is made of a metal oxide. For example, the first upper electrode layer 41 is made of strontium ruthenate (SRO), lithium nickel oxide (LNO), ruthenium oxide (RuOx), iridium oxide (IrOx), LaSrCoO$_3$, or the like. The metal oxide of the first upper electrode layer 41 is amorphous (non-crystalline). In other words, the first upper electrode layer 41 is made of a metal oxide including an amorphous portion at least at a boundary with the piezoelectric layer 3. In addition, the first upper electrode layer 41 is provided to suppress the reaction between the second upper electrode layer 42 and the piezoelectric layer 3. Specifically, the first upper electrode layer 41 functions as a barrier layer that suppresses movement of oxygen in the piezoelectric layer 3 to the second upper electrode layer 42.

When the thickness of a protective layer is small (when the thickness of the protective layer is about 20 nm or more and about 100 nm or less, for example), the first upper electrode layer 41 preferably has a thickness of about 2 nm or more and about 10 nm or less, for example. That is, when Ti is provided as the second upper electrode layer 42, deoxygenation from the piezoelectric layer 3 (PZT, for example) due to Ti cannot be prevented if the thickness of the first upper electrode layer 41 is less than about 2 nm. If the thickness of the first upper electrode layer 41 is more than about 10 nm, there is a high possibility that the first upper electrode layer 41 cracks. The first upper electrode layer 41 more preferably has a thickness of about 2 nm or more and about 5 nm or less, and occurrence of cracking is further reduced by setting the thickness to about 5 nm or less. Note that the protective layer is a layer above the first upper electrode layer 41. That is, the protective layer includes the second upper electrode layer 42, the third upper electrode layer 43, the insulating layer 5, and the lead-out wire 6.

When the thickness of the protective layer is large (when the thickness of the protective layer is more than about 20 nm and not more than about 1000 nm, for example), the first upper electrode layer 41 preferably has a thickness of about 2 nm or more and about and 40 nm or less, for example. That is, if the thickness of the first upper electrode layer 41 is more than about 40 nm, there is a high possibility that cracking occurs even when the protective layer is thick. The first upper electrode layer 41 more preferably has a thickness of about 2 nm or more and about 20 nm or less, and occurrence of cracking is further reduced by setting the thickness to about 20 nm or less. When Ti is provided as the second upper electrode layer 42, the thickness of the first upper electrode layer 41 is larger than the thickness of the second upper electrode layer 42.

The second upper electrode layer 42 is made of titanium (Ti). The second upper electrode layer 42 made of Ti functions as an adhesion layer. In particular, when gold (Au) is used for the third upper electrode layer 43, the second upper electrode layer 42 effectively functions as an adhesion layer. The second upper electrode layer 42 has a thickness of about 1 nm or more and about 20 nm or less, for example. The third upper electrode layer 43 is made of gold (Au). The third upper electrode layer 43 has a thickness of about 50 nm or more and about 500 nm or less, for example.

As shown in FIG. 1, the insulating layer 5 is provided to electrically insulate the lower electrode 2 from the lead-out wire 6. The insulating layer 5 is disposed to cover the lower electrode 2, the piezoelectric layer 3, and the upper electrode 4. The insulating layer 5 is made of silicon oxide (SiO$_2$), for example.

The lead-out wire 6 is connected to the upper electrode 4 so as to be able to supply electric power thereto. Specifically, the lead-out wire 6 is connected to the upper electrode 4 as to cover the upper electrode 4 in an open portion of the insulating layer 5. That is, the upper electrode 4 is covered with the insulating layer 5 and the lead-out wire 6. In other words, the insulating layer 5 and the lead-out wire 6 function as protective films that suppress occurrence of cracking in the upper electrode 4 when a voltage is applied to the piezoelectric element 100.

Method for Manufacturing Piezoelectric Element

A method for manufacturing the piezoelectric element 100 is now described.

The method for manufacturing the piezoelectric element 100 includes a step of thermally oxidizing a surface of the substrate 1, a step of forming the lower electrode 2 on the substrate 1, a step of forming the piezoelectric layer 3 on the lower electrode 2, a step of forming the upper electrode 4 on the piezoelectric layer 3, and a step of forming the insulating layer 5 and the lead-out wire 6 on the upper electrode 4.

In the step of thermally oxidizing the surface of the substrate 1, the silicon (Si) substrate 11 that constitutes the substrate 1 is thermally oxidized at a temperature of about 700° C. to form the silicon oxide layer 12 made of SiO$_2$ on the surface of the silicon substrate 11. In the step of forming the lower electrode 2 on the substrate 1, the first lower electrode layer 21, the second lower electrode layer 22, and the third lower electrode layer 23 of the lower electrode 2 are sequentially stacked by sputtering. At this time, the substrate 1 is heated to about 500° C. Thus, the metal oxide of the third lower electrode layer 23 crystallizes.

In the step of forming the piezoelectric layer 3 on the lower electrode 2, a ferroelectric material is stacked on the third lower electrode layer 23 of the lower electrode 2 by sputtering. At this time, the substrate 1 is heated to about 500° C. Thus, crystals having a perovskite structure are stacked as the piezoelectric layer 3.

The step of forming the upper electrode 4 on the piezoelectric layer 3 includes a step of forming the first upper electrode layer 41 made of a metal oxide including an amorphous portion at least at the boundary with the piezoelectric layer 3, a step of forming the second upper electrode layer 42 on the first upper electrode layer 41 under temperature conditions lower than a temperature at which the metal oxide of the first upper electrode layer 41 crystallizes, and a step of forming the third upper electrode layer 43 on the second upper electrode layer 42 under the temperature conditions lower than the temperature at which the metal oxide of the first upper electrode layer 41 crystallizes.

In the step of forming the upper electrode 4 on the piezoelectric layer 3, the first upper electrode layer 41, the second upper electrode layer 42, and the third upper electrode layer 43 of the upper electrode 4 are sequentially stacked by sputtering. At this time, the substrate 1 is not heated. That is, the step of forming the upper electrode 4 on the piezoelectric layer 3 is performed at about 80° C. or lower. Thus, the metal oxide of the first upper electrode layer 41 becomes amorphous without crystallization. Even in the subsequent steps, heat (heat of 300° C. or higher, for example) that causes the metal oxide of the first upper electrode layer 41 to crystallize is not applied. That is, all the steps after the step of forming the upper electrode 4 are performed under the temperature conditions lower than the temperature at which the metal oxide of the first upper electrode layer 41 crystallizes.

In the step of forming the insulating layer 5 and the lead-out wire 6 on the upper electrode 4, the insulating layer 5 is formed on the upper electrode 4. Then, the lead-out wire 6 is formed on the insulating layer 5. Thus, the piezoelectric element 100 is manufactured. Also when the piezoelectric element 100 is incorporated in an electronic device to manufacture the electronic device and when the piezoelectric element 100 incorporated in the electronic device is driven, the temperature is kept lower than the temperature at which the metal oxide of the first upper electrode layer 41 crystallizes.

Effects of Embodiment

According to this embodiment, the following effects can be obtained.

According to this embodiment, as hereinabove described, the upper electrode 4 includes the first upper electrode layer 41 made of a metal oxide including an amorphous portion at least at the boundary with the piezoelectric layer 3 such that even after application of an alternating-current voltage for a predetermined time, it is possible to suppress a decrease in the piezoelectric constant $d_{31}$ of the piezoelectric element 100. Thus, it is possible to suppress a deterioration in the performance of the piezoelectric element 100 due to use.

According to this embodiment, as hereinabove described, the metal oxide of the first upper electrode layer 41 includes strontium ruthenate. Thus, the first upper electrode layer 41 including strontium ruthenate (SRO) includes an amorphous portion at the boundary with the piezoelectric layer 3 such that when a voltage is applied to the piezoelectric element 100 to drive the same, the reaction between the first upper electrode layer 41 and the piezoelectric layer 3 can conceivably suppress a decrease in the piezoelectric constant $d_{31}$ of the piezoelectric element 100. Furthermore, it is possible to suppress an increase in the permittivity of the piezoelectric element 100. In addition, it is possible to effectively suppress movement of oxygen from the piezoelectric layer 3 made of a metal oxide to the second upper electrode layer 42, and hence it is conceivably possible to effectively suppress a decrease in the piezoelectric constant $d_{31}$ of the piezoelectric element 100 even after application of an alternating-current voltage for a predetermined time.

According to this embodiment, as hereinabove described, the thickness of the first upper electrode layer 41 is larger than the thickness of the second upper electrode layer 42. Thus, the thickness of the first upper electrode layer 41 formed between the piezoelectric layer 3 and the second upper electrode layer 42 can be increased, and hence it is possible to effectively suppress movement of oxygen from the piezoelectric layer 3 made of a metal oxide to the second upper electrode layer 42.

According to this embodiment, as hereinabove described, the thickness of the first upper electrode layer 41 is 2 nm or more and 40 nm or less. Thus, the thickness of the first upper electrode layer 41 is set to 2 nm or more such that it is possible to effectively suppress movement of oxygen from the piezoelectric layer 3 made of a metal oxide to the second upper electrode layer 42. Furthermore, the thickness of the first upper electrode layer 41 is set to 40 nm or less such that it is possible to suppress occurrence of cracking in the first upper electrode layer 41 including an amorphous metal oxide.

According to this embodiment, as hereinabove described, the second upper electrode layer 42 of the upper electrode 4 is made of reducible titanium, for example. Thus, even when reducible titanium is used for the upper electrode 4, the first upper electrode layer 41 can effectively suppress movement of oxygen from the piezoelectric layer 3 made of a metal oxide to the second upper electrode layer 42. As the second upper electrode layer 42 including a reducible element, chromium, tungsten, a compound thereof, etc. can be used in addition to the aforementioned titanium.

According to this embodiment, as hereinabove described, the protective layer of 100 nm or more is provided on the first upper electrode layer 41. Thus, it is possible to effectively suppress cracking of the first upper electrode layer 41 including an amorphous metal oxide.

Description of Example

Results (Example) of experiments conducted in order to evaluate the piezoelectric element 100 according to this embodiment are now described with reference to FIGS. 3 and 4. In Example shown in FIGS. 3 and 4, the first upper electrode layer 41 of the upper electrode 4 is made of SRO.

Figure 3:
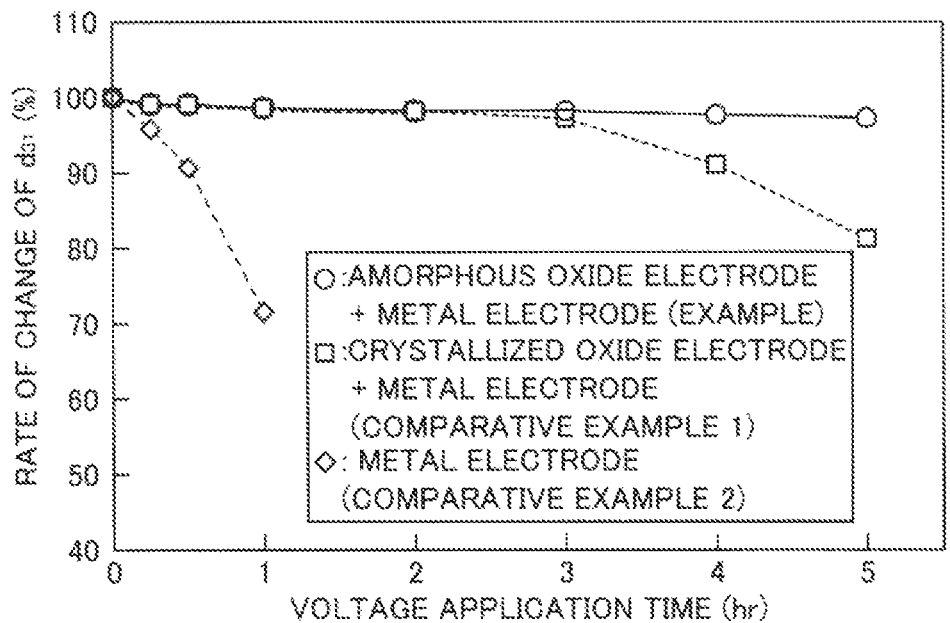
FIG. 3 A diagram for illustrating the rate of change of a piezoelectric constant $d_{31}$ in each of Example and Comparative Examples.

First, the rate of change of the piezoelectric constant $d_{31}$ at the time of AC voltage application shown in FIG. 3 is described. In a piezoelectric element of Example, an upper electrode includes an amorphous metal oxide electrode (first upper electrode layer 41) and metal electrodes (second and third upper electrode layers 42 and 43). In a piezoelectric element of Comparative Example 1, an upper electrode includes a crystallized metal oxide electrode and a metal electrode. In a piezoelectric element of Comparative Example 2, only a metal electrode is used as an upper electrode. The remaining structures of Example, Comparative Example 1, and Comparative Example 2 are the same as each other.

In each of Example, Comparative Example 1, and Comparative Example 2, a 500 Hz sine wave AC voltage (alternate-current voltage) of 0 to 45 V was applied to the piezoelectric element. The piezoelectric constant $d_{31}$ (the piezoelectric constant in a direction along the electrode surface) was measured at each time after the application of the AC voltage, and the rate of change was calculated with a value before the application of the AC voltage as a reference (100%).

As shown in FIG. 3, in Example, the piezoelectric constant $d_{31}$ did not substantially change from immediately after the application of the AC voltage until after the elapse of five hours. In Comparative Example 1, the piezoelectric constant $d_{31}$ decreased after three hours from the application of the AC voltage. In Comparative Example 2, the piezoelectric constant $d_{31}$ decreased immediately after the application of the AC voltage, and it became impossible to measure the piezoelectric constant $d_{31}$ after one hour. As described above, it has been found that it is possible to suppress a decrease in the piezoelectric constant $d_{31}$ of the piezoelectric element even after AC voltage application for a predetermined time by making the metal oxide electrode of the upper electrode amorphous. Thus, it has been found that it is possible to suppress a deterioration in the performance of the piezoelectric element due to use.

Figure 4:
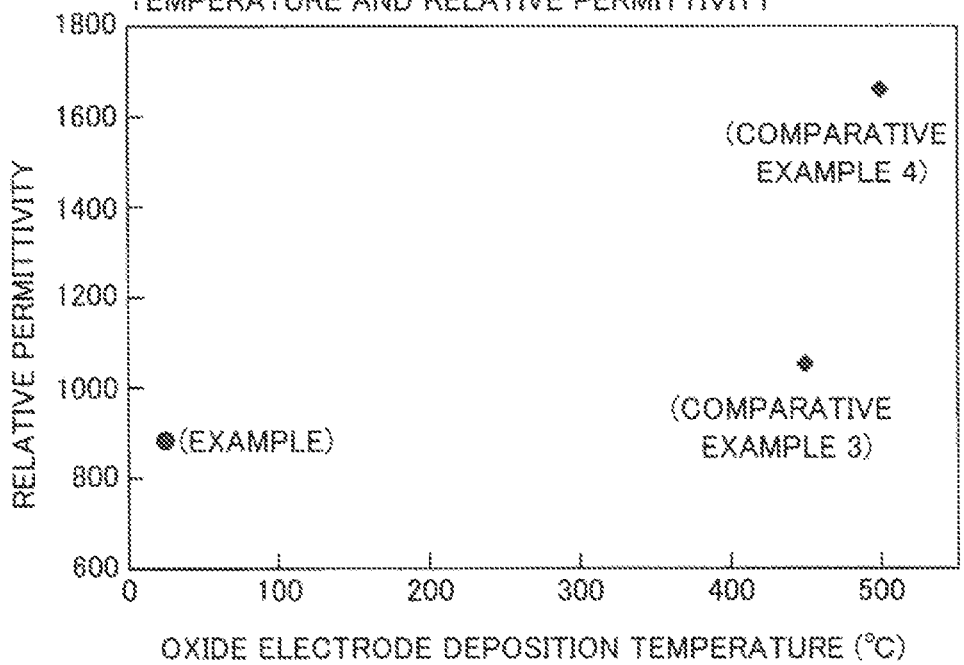
FIG. 4 A diagram for illustrating the relationship between a deposition temperature and a relative permittivity in each of Example and Comparative Examples.

Next, the relationship between an oxide electrode deposition temperature and a relative permittivity shown in FIG. 4 is described. In the piezoelectric element of Example, the metal oxide electrode (first upper electrode layer 41) of the upper electrode was deposited at a temperature of about 25° C. In a piezoelectric element of Comparative Example 3, a metal oxide electrode of an upper electrode was deposited at about 450° C. In a piezoelectric element of Comparative Example 4, a metal oxide electrode of an upper electrode was deposited at about 500° C.

As shown in FIG. 4, in Example, the relative permittivity was about 880. In Comparative Example 3, the relative permittivity was about 1050. In Comparative Example 4, the relative permittivity was about 1650. In other words, it has been found that in Comparative Examples 3 and 4 in which the metal oxide electrode is crystallized, the relative permittivity is increased. It has also been found that it is possible to suppress an increase in the relative permittivity by making the metal oxide electrode of the upper electrode amorphous.

Modifications

The embodiment and Example disclosed this time must be considered as illustrative in all points and not restrictive. The range of the present invention is shown not by the above description of the embodiment and Example but by the scope of claims for patent, and all modifications within the meaning and range equivalent to the scope of claims for patent are further included.

For example, while the example in which the piezoelectric element according to the present invention is used as an actuator has been shown in the aforementioned embodiment, the present invention is not restricted to this. According to the present invention, the piezoelectric element may be used as an apparatus that converts a voltage into a force other than the actuator. Alternatively, the piezoelectric element may be used as an apparatus that converts a force into a voltage. For example, the piezoelectric element may be used as a sensor.

While the example in which the lower electrode is formed on the substrate has been shown in the aforementioned embodiment, the present invention is not restricted to this. According to the present invention, a base film may be provided on the substrate, and the lower electrode may be formed on the base film.

While the example in which the first upper electrode layer (first electrode layer) of the upper electrode is made of an amorphous metal oxide has been shown in the aforementioned embodiment, the present invention is not restricted to this. According to the present invention, the first electrode layer of the upper electrode is only required to include a portion of an amorphous metal oxide at least at the boundary with the piezoelectric layer.

While the example in which the first upper electrode layer (first electrode layer) of the upper electrode is made of an amorphous metal oxide has been shown in the aforementioned embodiment, the present invention is not restricted to this. According to the present invention, heat may be applied by laser irradiation to locally and partially crystallize the first electrode layer of the upper electrode. Thus, it is possible to effectively suppress occurrence of cracking in the upper electrode when the piezoelectric element is driven.

While the example in which the second upper electrode layer (second electrode layer) of the upper electrode is made of titanium (Ti) has been shown in the aforementioned embodiment, the present invention is not restricted to this. According to the present invention, the second electrode layer of the upper electrode may be made of a material other than titanium. For example, the second electrode layer of the upper electrode may be made of platinum (Pt). Alternatively, as the upper electrode layer, a layer of SRO and a layer of Pt may be provided in this order from the piezoelectric layer side. Alternatively, as the upper electrode, a layer of SRO, a layer of Pt, a layer of Ti, and a layer of Au may be provided in this order from the piezoelectric layer side. Alternatively, as the upper electrode, a layer of SRO, a layer of Ti, and a layer of Au may be provided in this order from the piezoelectric layer side. Alternatively, as the upper electrode, a layer of SRO, a layer of Pt, and a layer of Au may be provided in this order from the piezoelectric layer side.

DESCRIPTION OF REFERENCE NUMERALS

1: substrate
2: lower electrode
3: piezoelectric layer
4: upper electrode
5: insulating layer (protective layer)
6: lead-out wire (protective layer)
41: first upper electrode layer (first electrode layer)
42: second upper electrode layer (second electrode layer, protective layer)
43: third upper electrode layer (third electrode layer, protective layer)
100: piezoelectric element

The invention claimed is:

1. A piezoelectric element incorporated in an electronic device, comprising:
    a lower electrode formed on a substrate or a base film;
    a piezoelectric layer formed on the lower electrode; and
    an upper electrode formed on the piezoelectric layer, wherein
    the upper electrode includes a first electrode layer made of a metal oxide including an amorphous portion at least at a boundary with the piezoelectric layer and a second electrode layer formed on the first electrode layer,
    a protective layer having a thickness of more than 20 nm and not more than 1000 nm is provided on the first electrode layer,
    the first electrode layer has a thickness of 2 nm or more and 20 nm or less, and
    the lower electrode is made of a metal oxide crystallized at a boundary with the piezoelectric layer.

2. The piezoelectric element according to claim 1, wherein
    the lower electrode includes a first lower electrode layer formed on the substrate or the base film, a second lower electrode layer formed on the first lower electrode layer and made of a material different from a material for the first lower electrode layer, and a third lower electrode layer formed on the second lower electrode layer, made of the crystallized metal oxide, and in contact with the piezoelectric layer, and
    a thickness of the second lower electrode layer is larger than a thickness of the first lower electrode layer.

3. The piezoelectric element according to claim 2, wherein
    the first lower electrode layer is made of titanium, and
    the second lower electrode layer is made of platinum.

4. The piezoelectric element according to claim 1, wherein
    the metal oxide of the first electrode layer includes strontium ruthenate.

5. The piezoelectric element according to claim 1, wherein
    the second electrode layer includes a reducible metal atom.

6. The piezoelectric element according to claim 1, wherein
    the protective layer has a thickness of 100 nm or more.

7. A method for manufacturing a piezoelectric element, comprising:
    forming a lower electrode on a substrate or a base film;
    forming a piezoelectric layer on the lower electrode;
    forming an upper electrode on the piezoelectric layer; and forming a protective layer having a thickness of more than 20 nm and not more than 1000 nm on the first electrode layer, wherein the forming of the upper electrode includes forming a first electrode layer made of a metal oxide including an amorphous portion at least at a boundary with the piezoelectric layer and forming a second electrode layer on the first electrode layer under a temperature condition lower than a temperature at which the metal oxide of the first electrode layer crystallizes, the forming of the lower electrode includes crystallizing a metal oxide at a boundary with the piezoelectric layer, and wherein the first electrode layer has a thickness of 2 nm or more and 20 nm or less.

8. The method for manufacturing a piezoelectric element according to claim 7, wherein the forming of the lower electrode includes forming a first lower electrode layer on the substrate or the base film, forming a second lower electrode layer, made of a material different from a material for the first lower electrode layer, on the first lower electrode layer, and forming a third lower electrode layer in contact with the piezoelectric layer by crystallizing the metal oxide on the second lower electrode layer, and in the forming of the second lower electrode layer, the second lower electrode layer is formed such that a thickness of the second lower electrode layer is larger than a thickness of the first lower electrode layer.

9. The method for manufacturing a piezoelectric element according to claim 8, wherein the first lower electrode layer is made of titanium, and the second lower electrode layer is made of platinum.

10. The method for manufacturing a piezoelectric element according to claim 7, wherein all steps after the forming of the upper electrode are performed under the temperature condition lower than the temperature at which the metal oxide of the first electrode layer crystallizes.

11. The method for manufacturing a piezoelectric element according to claim 7, further comprising forming an insulating layer on the upper electrode to cover the upper electrode.

12. A piezoelectric element incorporated in an electronic device, comprising:

a lower electrode formed on a substrate or a base film;
a piezoelectric layer formed on the lower electrode;
an upper electrode formed on the piezoelectric layer; and
an insulating layer formed on the upper electrode and that covers the upper electrode, wherein
the upper electrode includes a first electrode layer made of a metal oxide including an amorphous portion at least at a boundary with the piezoelectric layer and a second electrode layer formed on the first electrode layer, a protective layer having a thickness of more than 20 nm and not more than 1000 nm is provided on the first electrode layer, the first electrode layer has a thickness of 2 nm or more and 20 nm or less, and the lower electrode is made of a metal oxide crystallized at a boundary with the piezoelectric layer.

13. The piezoelectric element according to claim 12, wherein the lower electrode includes a first lower electrode layer formed on the substrate or the base film, a second lower electrode layer formed on the first lower electrode layer and made of a material different from a material for the first lower electrode layer, and a third lower electrode layer formed on the second lower electrode layer, made of the crystallized metal oxide, and in contact with the piezoelectric layer, and a thickness of the second lower electrode layer is larger than a thickness of the first lower electrode layer.

14. The piezoelectric element according to claim 13, wherein the first lower electrode layer is made of titanium, and the second lower electrode layer is made of platinum.

15. The piezoelectric element according to claim 12, further comprising a lead-out wire formed along the upper electrode, wherein the lead-out wire as well as the insulating layer covers the upper electrode.

16. The piezoelectric element according to claim 12, wherein the insulating layer is disposed to cover the lower electrode, the piezoelectric layer, and the upper electrode along an upper surface of the lower electrode, a side surface of the piezoelectric layer, and an upper surface of the upper electrode.

17. The piezoelectric element according to claim 12, wherein the insulating layer is disposed to cover the lower electrode, the piezoelectric layer, and the upper electrode along an upper surface of the lower electrode, a side surface of the piezoelectric layer, an upper surface of an edge of the piezoelectric layer, and an upper surface of the upper electrode.

18. The piezoelectric element according to claim 12, wherein the insulating layer is disposed to cover the lower electrode, the piezoelectric layer, and the upper electrode along an upper surface of the lower electrode, a side surface of the piezoelectric layer, an upper surface of an edge of the piezoelectric layer, and an upper surface of the upper electrode, the piezoelectric element further comprising a lead-out wire formed along the upper electrode, wherein the lead-out wire as well as the insulating layer covers the upper electrode.

* * * * *